US012635406B2

(12) United States Patent
Kim et al.

(10) Patent No.: US 12,635,406 B2
(45) Date of Patent: May 19, 2026

(54) THIN-FILM TRANSISTOR, DISPLAY APPARATUS INCLUDING THE SAME, AND METHOD OF PREPARING THE THIN-FILM TRANSISTOR

(71) Applicants: Samsung Display Co., Ltd., Yongin-si (KR); Postech Research And Business Development Foundation, Pohang-si (KR)

(72) Inventors: Hyungjun Kim, Yongin-si (KR); Yongyoung Noh, Pohang-si (KR); Junhyung Lim, Yongin-si (KR); Huihui Zhu, Pohang-si (KR)

(73) Assignees: SAMSUNG DISPLAY CO., LTD., Gyeonggi-Do (KR); POSTECH RESEARCH AND BUSNIESS DEVELOPMENT FOUNDATION, Pohang-si (KR)

( * ) Notice: Subject to any disclaimer, the term of this patent is extended or adjusted under 35 U.S.C. 154(b) by 596 days.

(21) Appl. No.: 18/086,797

(22) Filed: Dec. 22, 2022

(65) Prior Publication Data

US 2023/0209994 A1      Jun. 29, 2023

(30) Foreign Application Priority Data

Dec. 24, 2021    (KR) ........................ 10-2021-0187764

(51) Int. Cl.
*H10K 85/50*      (2023.01)
*H10K 10/46*      (2023.01)
(52) U.S. Cl.
CPC ........... *H10K 85/50* (2023.02); *H10K 10/466* (2023.02)
(58) Field of Classification Search
CPC ...................... H10K 10/46–491; H10K 85/50
See application file for complete search history.

(56) References Cited

U.S. PATENT DOCUMENTS

2016/0268510 A1* 9/2016 Moon ........................ C07F 7/22
2017/0222162 A1 8/2017 Lee et al.
(Continued)

FOREIGN PATENT DOCUMENTS

| JP | 2021052080 A | 4/2021 |
| KR | 1020170090216 A | 8/2017 |
| KR | 1020210028974 A | 3/2021 |

OTHER PUBLICATIONS

Solar Syed Afaq Ali Shah et al., "Progress towards High-Efficiency and Stable Tin-Based Perovskite Solar Cells," Energies, Sep. 29, 2020, pp. 1-42, vol. 13, No. 5092.

*Primary Examiner* — Daniel P Shook
(74) *Attorney, Agent, or Firm* — CANTOR COLBURN LLP

(57) ABSTRACT

A thin-film transistor including: a gate electrode; a gate insulating layer that is in contact with the gate electrode; a semiconductor layer insulated from the gate electrode by the gate insulating layer; and a source electrode and a drain electrode that are in contact with the semiconductor layer, wherein the semiconductor layer includes a perovskite compound represented by Formula 1:

$$[A]_2[B][X]_6:Z \qquad \text{Formula 1}$$

wherein, in Formula 1,
A includes a monovalent organic-cation, a monovalent inorganic-cation, or a combination thereof,
B includes $Sn^{4+}$,
X includes a monovalent anion, and
Z includes a metal cation or a metalloid cation.

20 Claims, 15 Drawing Sheets

(56)        References Cited

U.S. PATENT DOCUMENTS

2018/0151303  A1      5/2018  Maimon
2018/0337004  A1     11/2018  Kwon et al.

* cited by examiner

10A $A_2BX_6$

○   A $BX_6$ octahedra

THIN-FILM TRANSISTOR, DISPLAY APPARATUS INCLUDING THE SAME, AND METHOD OF PREPARING THE THIN-FILM TRANSISTOR

CROSS-REFERENCE TO RELATED APPLICATION

This application claims priority to and the benefit of Korean Patent Application No. 10-2021-0187764, filed on Dec. 24, 2021, in the Korean Intellectual Property Office, and all the benefits accruing therefrom under 35 U.S.C. § 119, the content of which in its entirety is herein incorporated by reference.

BACKGROUND

1. Field

One or more embodiments relate to a thin-film transistor, a display apparatus including the same, and a method of preparing the thin-film transistor.

2. Description of the Related Art

In recent years, use of display devices has become diversified. As display devices become thinner and lighter, the range of use of display devices is expanding.

To improve the image quality of a display apparatus, performance improvement of a thin-film transistor inside the display apparatus should be considered.

Improving film quality may improve performance of the thin-film transistor.

SUMMARY

An embodiment include a thin-film transistor having improved performance, a display apparatus including the same, and a method of preparing the thin-film transistor.

Additional aspects will be set forth in part in the description which follows and, in part, will be apparent from the description, or may be learned by practice of the presented embodiments of the disclosure.

According to an embodiment, a thin-film transistor includes a gate electrode, a gate insulating layer that is in contact with the gate electrode, a semiconductor layer insulated from the gate electrode by the gate insulating layer, and a source electrode and a drain electrode that are in contact with the semiconductor layer, wherein the semiconductor layer includes a perovskite compound represented by Formula 1

$$[A]_2[B][X]_6{:}Z \qquad\qquad \text{Formula 1}$$

wherein, in Formula 1, A includes a monovalent organic-cation, a monovalent inorganic-cation, or a combination thereof, B includes $Sn^{4+}$, X includes a monovalent anion, and Z includes a metal cation or a metalloid cation, each doped with $[A]_2[B][X]_6$.

According to an embodiment, a display apparatus includes a light-emitting device and the thin-film transistor, the light-emitting device including a first electrode, a second electrode facing the first electrode, and an interlayer between the first electrode and the second electrode, wherein one of the source electrode and the drain electrode of the thin-film transistor is electrically connected to first electrode of the light-emitting device.

According to an embodiment, a method of preparing the thin-film transistor includes forming a gate electrode on a substrate, forming a gate insulating layer on the substrate, forming a semiconductor layer on the gate insulating layer, and forming a source electrode and a drain electrode on the semiconductor layer, wherein the forming of the semiconductor layer includes a first step of obtaining a first solution containing a first precursor including A, a second precursor including B, and a first solvent, a second step of obtaining a second solution containing an additive including Z and a second solvent, and a third step of mixing the first solution and the second solution, wherein the first solvent includes dimethyl formamide (DMF) and dimethyl sulfoxide (DMSO), A includes a monovalent organic-cation, a monovalent inorganic-cation, or a combination thereof, B includes $Sn^{4+}$, and Z includes a metal cation or a metalloid cation.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
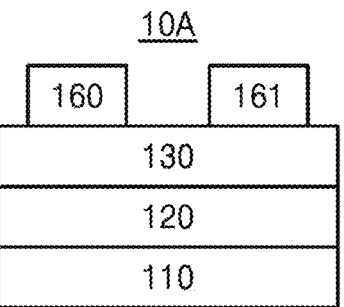
FIG. 1 is a schematic diagram of a thin-film transistor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. "At least one" is not to be construed as limiting "a" or "an." "Or" means "and/or."

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

Hereinafter, embodiments of the present disclosure will be described in detail with reference to the accompanying drawings. The same or corresponding components will be denoted by the same reference numerals, and thus redundant description thereof will be omitted.

It will be understood that although the terms "first," "second," etc. may be used herein to describe various components, these components should not be limited by these terms. These components are only used to distinguish one component from another.

An expression used in the singular encompasses the expression of the plural, unless it has a clearly different meaning in the context. For example, as used herein, "a", "an," "the," and "at least one" do not denote a limitation of quantity, and are intended to include both the singular and plural, unless the context clearly indicates otherwise; "an element" has the same meaning as "at least one element," unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or component is referred to as being "on" or "onto" another layer, region, or component, it may be directly or indirectly formed over the other layer, region, or component. That is, for example, intervening layers, regions, or components may be present. Sizes of components in the drawings may be exaggerated for convenience of explanation. In other words, because sizes and thicknesses of components in the drawings are arbitrarily illustrated for convenience of explanation, the following embodiments are not limited thereto. In contrast, when an element is referred to as being "directly on" another element, there are no intervening elements present.

When a certain embodiment is implemented differently, a specific process order may be performed differently from the described order. For example, two processes described in succession may be performed substantially simultaneously or may be performed in an order opposite to the described order.

It will be understood that when a layer, region, or component is referred to as being "connected to" another layer, region, or component, the layer, region, or component may be directly connected to the other layer, region, or component, or indirectly connected to the other layer, region, or component as intervening layer, region, or component is present. For example, it will be understood that when a layer, region, or component is referred to as being "electrically connected to" another layer, region, or component, the layer, region, or component may be directly electrically connected to the other layer, region, or component, or indirectly electrically connected to the other layer, region, or component as intervening layer, region, or component is present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The term "Group" as used herein refers to a group on the IUPAC periodic table.

The term "Period" as used herein refers to a period on the IUPAC periodic table.

The term "metal" as used herein may include an alkali metal, an alkaline earth metal, a transition metal, a post-transition metal, a lanthanide metal, and an actinide metal.

The term "metalloid" as used herein may include boron (B), silicon (Si), germanium (Ge), arsenic (As), antimony (Sb), and tellurium (Te).

The term "halogen" as used herein refers to a Group 17 element.

The term "perovskite" as used herein refers to a compound in which a first cation is positioned at (0,0,0), a second cation is positioned at (1/2,1/2,1/2), and an anion is positioned at (1/2,1/2,0). The "perovskite" as used herein is understood as having not only an ideal symmetrical structure of $CaTiO_3$, but also a twisted structure having a symmetry that is lower than the ideal symmetrical structure.

Hereinafter, a thin-film transistor, a display device including the same, and a method of preparing the thin-film transistor will be described in detail with reference to the accompanying drawings.

Thin-Film Transistor

FIG. 1 is a schematic diagram of a thin-film transistor 10A according to an embodiment.

Referring to FIG. 1, the thin-film transistor 10A includes: a gate electrode 110; a gate insulating layer 120 that is in contact with the gate electrode 110; a semiconductor layer 130 insulated from the gate electrode 110 by the gate insulating layer 120; and a source electrode 160 and a drain electrode 161 that are in contact with the semiconductor layer 130.

The gate electrode 110 may be formed of a metal material having good conductivity, and may be single-layered or multi-layered formed using aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a combination thereof. For example, the gate electrode 110 may include Au, Ag, Cu, Ni, Pt, Pd, Al, or Mo, or an alloy such as an Al:Nd alloy or a Mo:W alloy. However, such a metal material is an example, and is not limited thereto. The gate electrode 110 may be formed of a suitable material.

Figure 4:
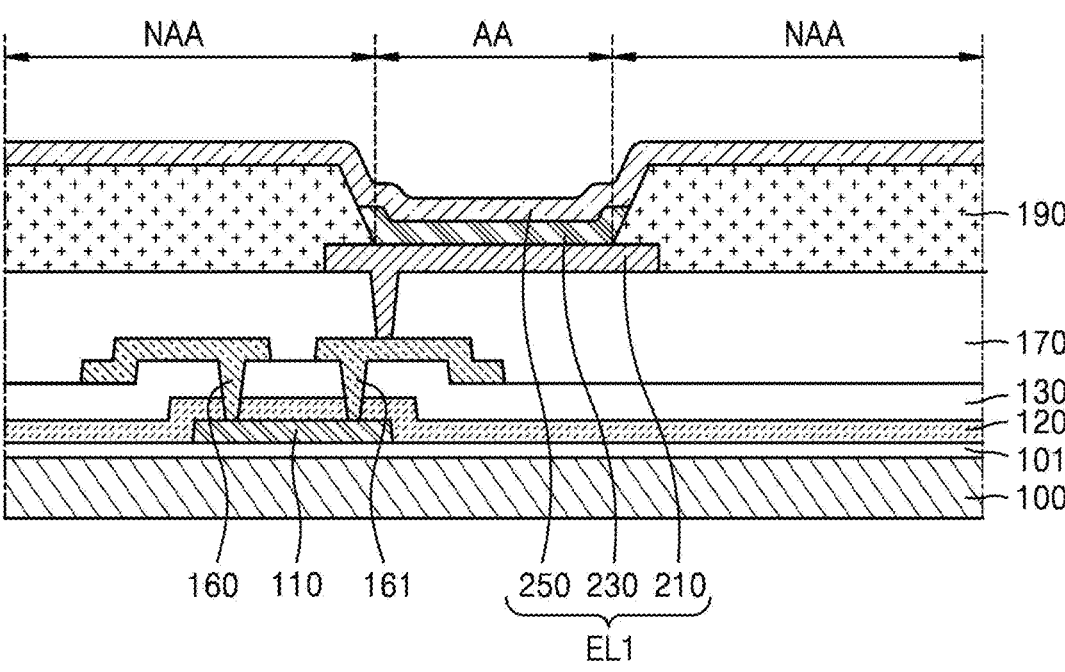
FIG. 4 is a schematic block diagram of a configuration of a display device according to an embodiment.

The gate electrode 110 may be formed on a substrate (not shown, see FIG. 4).

The gate insulating layer 120 may be formed on the gate electrode 110. Here, the gate insulating layer 120 may be formed using a suitable insulating material, for example, an oxide or a nitride. The gate insulating layer 120 may insulate the gate electrode 110 and the semiconductor layer 130.

The gate insulating layer 120) may include silicon oxide, silicon nitride, silicon oxynitride, or aluminum oxide.

The semiconductor layer 130 may be formed on the gate insulating layer 120. The semiconductor layer 130 may include a perovskite compound represented by Formula 1:

$$[A]_2[B][X]_6:Z \qquad \text{Formula 1}$$

wherein, in Formula 1, A may include a, e.g., at least one, monovalent organic-cation, a, e.g., at least one, monovalent inorganic-cation, or a combination thereof.

Figure 2:
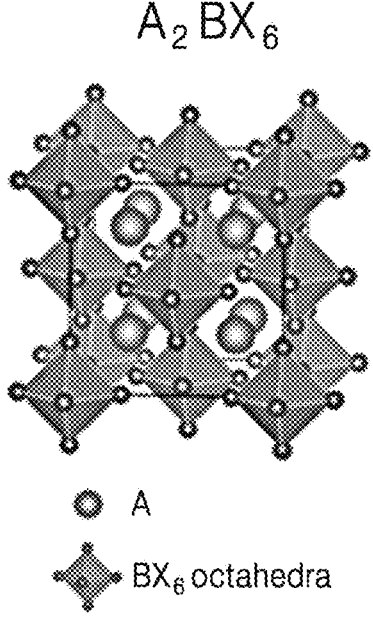
FIG. 2 is a diagram of a crystal structure of a perovskite compound represented by Formula 1.

FIG. 2 is a diagram of a crystal structure of the perovskite compound represented by the Formula 1.

In an embodiment, A may include $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a monovalent cation of a substituted or unsubstituted nitrogen-containing 5-membered ring, a monovalent cation of a substituted or unsubstituted nitrogen-containing 6-membered ring, $Li^+$, $Na^+$, $K^+$, $Rb^+$, $Cs^+$, $Fr^+$, or a combination thereof, wherein $R_1$, $R_2$, $R_3$, $R_4$, and $R_5$, a substituent of the monovalent cation of the substituted nitrogen-containing 5-membered ring, and a substituent of the monovalent cation of the substituted nitrogen-containing 6-membered ring may each independently be hydrogen, deuterium, —F, —Cl, —Br, —I, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{60}$ aryl group, or —$N(Q_1)(Q_2)$, and $Q_1$, and $Q_2$ may each independently be hydrogen, deuterium, a hydroxyl group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_6$-$C_{60}$ aryl group.

For example, A may be $Cs^+$.

In Formula 1, B may be an $Sn^{4+}$ ion.

In Formula 1, X may be a, e.g., at least one, monovalent anion.

In an embodiment, X may be a, e.g., at least one, halide anion.

For example, X may be $I^-$.

In Formula 1, $[A]_2[B][X]_6$ may be doped with Z. The expression "Y:Z" as used herein may refer that Y is doped with Z. For example, Z may act as a dopant, but is not limited thereto.

In Formula 1, Z may be a metal cation or a metalloid cation.

In an embodiment, Z may be $Mn^{2+}$, $Bi^{3+}$, $Sb^{3+}$, or $In^{3+}$.

For example, Z may be $Mn^{2+}$.

In an embodiment, an amount of Z in the semiconductor layer 130 may be in a range of about 0.1 mole percent (mol %) to about 30 mol %, about 0.5 mol % to about 20 mol %, or about 1 mol % to about 10 mol %, based on 100 mol % of the number of moles of B, e.g., a total number of moles of B.

According to an embodiment, the semiconductor layer 130 may include a perovskite compound represented by Formula 1:

$$[A]_2[B][X]_6:Z \qquad \text{Formula 1}$$

wherein, in Formula 1, A includes $Li^+$, $Na^+$, $K^+$, $Rb^+$, $Cs^+$, $Fr^+$, or a combination thereof, B includes $Sn^{4+}$, X includes a halide anion, and Z includes $Mn^{2+}$, $Bi^{3+}$, $Sb^{3+}$, or $In^{3+}$, and wherein an amount of Z in the semiconductor layer is in a range of about 1 mole percent to about 10 mole percent, based on a total number of moles of B.

The source electrode 160 may be single-layered or multi-layered formed using aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a combination thereof. For example, the source electrode 160 may have a three-layered structure of Mo/Al/Mo, Mo/Al/Ti, or Ti/Al/Ti. In an embodiment, the source electrode 160 may be formed of Mo/Al/Ti. Descriptions of the drain electrode 161 may be the same as the source electrode 160. For example, the source electrode 160 and the drain electrode 161 may each be formed of two or more layers.

In the thin-film transistor disclosed herein, the semiconductor layer may include the perovskite compound including $Sn^{4+}$, wherein the perovskite compound may be doped with a metal cation (for example, $Mn^{2+}$) or a metalloid cation.

By using the perovskite compound as the semiconductor layer, the thin-film transistor disclosed herein may have excellent air stability and may simultaneously have high electron mobility and excellent current on-off ratio.

In an embodiment, the electron mobility of the thin-film transistor may be in a range of about 0.5 square centimeters per volt-second ($cm^2/Vs$) to about 10 $cm^2/Vs$, about 0.5 $cm^2/Ns$ to about 8 $cm^2/Vs$, or about 0.5 $cm^2/Vs$ to about 5 $cm^2/Vs$.

In an embodiment, the current on-off ratio of the thin-film transistor may be in a range of about 10:1 to about 105:1 or about $10^2$:1 to about 105:1. The current on-off ratio refers to a ratio of the smallest current value to the largest current value.

Display Apparatus

Figure 3:
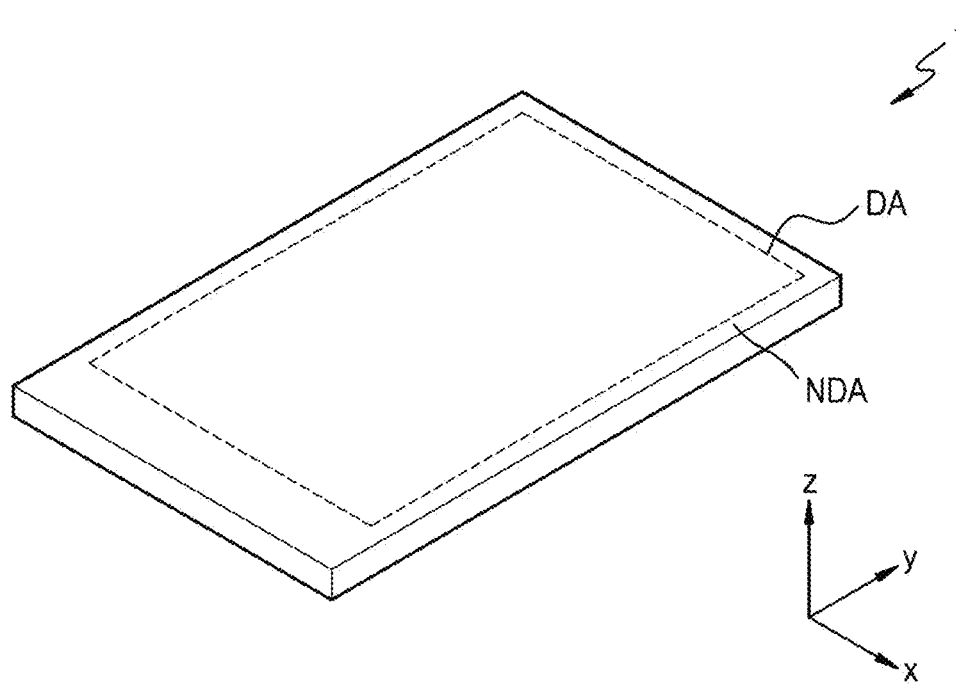
FIG. 3 is a schematic perspective view of a display apparatus according to an embodiment.

FIG. 3 is a perspective view of a display apparatus 1 according to an embodiment. Referring to FIG. 3, the display apparatus 1 includes a display area (DA) and a non-display area (NDA) located outside the display area DA. In the display area DA, a suitable display device, such as an organic light-emitting device (OLED), may be located. In the non-display area NDA, a suitable wiring that transmit electrical signals to be applied to the display area DA including the thin-film transistor may be located. In non-display area NDA, one thin-film transistor may be located, but a plurality of thin-film transistors and a capacitor may be further included along with wirings, such as scan lines, data lines, and power lines, that are connected thereto.

In FIG. 3, the display apparatus 1 having a rectangular display area DA is shown, but is not limited thereto. The shape of the display area DA may be a circle, an ellipse, or a polygon such as a triangle or a pentagon. In addition, in FIG. 3, the display apparatus 1 is a flat panel display apparatus, but may be implemented in a suitable form such as a flexible, foldable, and rollable display device.

Hereinafter, for convenience, an organic light-emitting display apparatus is provided as an example of the display apparatus 1 according to an embodiment, but is not limited thereto. In an embodiment, a suitable display apparatus, such as an inorganic electroluminescence (EL) display apparatus or a quantum dot light-emitting display apparatus, may be used.

FIG. 4 is a schematic diagram showing a configuration of a display device according to an embodiment.

Referring to FIG. 4, the display apparatus 1 according to an embodiment may include a substrate 100; a light-emitting device EL1; and the thin-film transistor.

The substrate 100 may include a suitable material such as a glass, a metal, a metal oxide, a metal nitride, or a plastic. For example, the substrate 100 may include a polyether sulfone, a polyacrylate, a polyetherimide, a polyethylene naphthalate, a polyethylene terephthalate, a polyphenylene sulfide, a polyarylate, a polyimide, a polycarbonate, a cellulose acetate propionate, or the like.

The substrate 100 may be formed of a glass material including $SiO_2$ as a main component. The substrate 100 is not essentially limited thereto, and may be formed of a plastic material. Here, such a plastic material for forming the substrate 100 may be a suitable organic material. In embodiment, the substrate 100 may be formed of a metal thin-film.

The substrate 100 may have flexible, rollable, or bendable properties. The substrate 100 may have a multi-layered structure, wherein each constituent layer may include a different material.

A buffer layer 101 may be located on the substrate 100. The buffer layer 101 may help prevent penetration of impurities through the substrate 100 and provide a flat surface on the substrate 100. In this regard, the buffer layer 101 may be formed of a suitable material capable of performing such a role.

A thin-film transistor may be located on the buffer layer 101.

One of a source electrode 160 and a drain electrode 161 of the thin-film transistor may be electrically connected to a first electrode 210 of the light-emitting device EL1. As shown in FIG. 4, in an embodiment, the first electrode 210 of the light-emitting device EL1 and the drain electrode 161 may be electrically connected. The source electrode 160 and the drain electrode 161 may each be the same as described herein.

A passivation layer 170 may be formed to cover the source electrode 160 and the drain electrode 161. The passivation layer 170 may include an inorganic insulating layer, an organic insulating layer, or a combination thereof. The first electrode 210 may be located on the passivation layer 170. The passivation layer 170 may be located to expose a portion of the drain electrode 161 without fully covering the drain electrode 161, and the first electrode 210 may be arranged to be connected to the exposed portion of the drain electrode 161. In an embodiment, the passivation layer 170 may be omitted.

A pixel-defining layer 190 including an insulating material may be located on the first electrode 210. The pixel-defining layer 190 may expose a portion of the first electrode 210, and an interlayer 230 may be formed in the exposed portion of the first electrode 210. The pixel-defining layer 190 may be a polyimide-based organic film or a polyacryl-based organic film. Although not shown in FIG. 4, one or more layers of the interlayer 230 may extend to the upper portion of the pixel-defining layer 190 to be located in the form of a common layer.

The light-emitting device EL1 may include: the first electrode 210; a second electrode 250 facing the first electrode 210; and the interlayer 230 between the first electrode 210 and the second electrode 250.

When the light-emitting device EL1 is a top-emission light-emitting device, the first electrode 210 may be formed as a reflective electrode. Such a reflective electrode may include: a reflective layer including Ag, Mg, AI, Pt, Pd, Au, Ni, Nd, Ir, Cr, or a compound thereof; and a transparent electrode layer or a semi-transparent electrode layer on the reflective layer. When the light-emitting device EL1 is a bottom-emission light-emitting device, the first electrode 210 may include a transparent material, such as indium tin oxide (ITO), indium zinc oxide (IZO), ZnO, or $In_2O_3$, and may be formed as a transparent electrode or a semi-transparent electrode.

The interlayer 230 may include an emission layer that emits light, and may further include, in addition to the emission layer, a, e.g., at least one, functional layer such as a hole injection layer (HIL) or a hole transport layer (HTL) included in a hole transport region or an electron transport layer (ETL) or an electron injection layer (EIL) included in an electron transport region.

In an embodiment, a suitable functional layer may be additionally located on the first electrode 210, and the emission layer may be a red emission layer, a green emission layer, or a blue emission layer.

In an embodiment, the emission layer may have a multi-layered structure in which a red emission layer, a green emission layer, and a blue emission layer are stacked to emit white light.

In an embodiment, the emission layer may have a single-layered structure in which a red light-emitting material, a green light-emitting material, and a blue light-emitting material are included to emit white light. Then, the second electrode 250 may be provided on the interlayer 230. The second electrode 250 may be a reflective electrode, a transparent electrode, or a semi-transparent electrode. For example, the second electrode 250 may include a metal having a small work function, such as Li, Ca, LiF/Ca, LiF/Al, Al, Ag, Mg, or a combination thereof.

In an embodiment, the interlayer 230 may be provided only in an emission area AA using a mask, for example, a fine metal mask (FMM), having an opening corresponding to the emission area AA of the display apparatus 1.

In an embodiment, the emission layer of the interlayer 230 may be provided only in the emission area AA using an FMM having an opening corresponding to the emission area AA, and other functional layers may be provided using an open mask in the entire surface of the emission area AA and a non-emission area NAA. Then, the second electrode 250 may be provided on the interlayer 230. The second electrode 250 may be a reflective electrode, a transparent electrode, or a semi-transparent electrode. For example, the second electrode 250 may include a metal having a small work function, such as Li, Ca, LiF/Ca, LiF/Al, Al, Ag, Mg, or a combination thereof. Although not shown in FIG. 4, the display apparatus 1 may further include an opposite substrate on the second electrode 250. The opposite substrate may be the same as described in connection with the substrate 100.

Although not shown in FIG. 4, a black matrix BM and a color filter CF may be arranged on a surface of the opposite substrate facing the substrate 100. The color filter CF may be arranged to correspond to the emission area AA of the display apparatus 1. The black matrix BM may be arranged to correspond to an area excluding the emission area AA of the display apparatus 1.

Although not shown in FIG. 4, a protective layer may be further arranged between the opposite substrate and the second electrode 250. The protective layer may be single-layered or multi-layered inorganic film, organic film, or a combination thereof.

In addition, although not shown in FIG. 4, a suitable functional layer may be further provided on the opposite substrate. For example, a functional layer may include an anti-reflection layer that minimizes reflection on the upper surface of the opposite substrate, or an anti-contamination layer that may help prevents contamination such as a hand-print mark (for example, a fingerprint mark) of a user.

In an embodiment, a thin-film encapsulation layer, instead of the opposite substrate, may be arranged on the substrate 100. The thin-film encapsulation layer may include an inorganic encapsulation layer including, e.g., consisting of, an, e.g., at least one, inorganic material and an organic encapsulation layer including, e.g., consisting of, an, e.g., at least one, organic material.

In an embodiment, the thin-film encapsulation layer may have a stacked structure of first inorganic encapsulation layer/organic encapsulation layer/second inorganic encapsulation layer.

Preparation Method of Thin-Film Transistor

The method of preparing the thin-film transistor according to the present disclosure may include: providing the substrate 100; forming the gate electrode 110 on the substrate 100; forming the gate insulating layer 120 on the gate electrode 110; forming the semiconductor layer 130 on the gate insulating layer 120; and forming a source electrode 160 and a drain electrode 161 on the semiconductor layer 130.

The forming of the semiconductor layer 130 may include: a first step of obtaining a first solution containing a first precursor including A, a second precursor including B, and a first solvent; a second step of obtaining a second solution containing an additive including Z and a second solvent; and a third step of mixing the first solution and the second solution. Here, the first step and the second step do not include a time-based order. For example, both a case where the second step is performed after the first step and a case where the first step is performed after the second step may be included.

In the first step, the first solution may be obtained by dissolving the first precursor including A and the second precursor including B in the first solvent.

The first precursor may include A, and A may include a, e.g., at least one, monovalent organic-cation, a, e.g., at least one, monovalent inorganic-cation, or a combination thereof.

In an embodiment, A may be $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N\!=\!C(R_3)\!-\!NR_4R_5)\text{+}$, a monovalent cation of a substituted or unsubstituted nitrogen-containing 5-membered ring, a monovalent cation of a substituted or unsubstituted nitrogen-containing 6-membered ring, $Li^+$, $Na^+$, $K^+$, $Rb^+$, $Cs^+$, $Fr^+$, or a combination thereof, wherein $R_1$, $R_2$, $R_3$, $R_4$, and $R_5$, a substituent of the monovalent cation of the substituted nitrogen-containing 5-membered ring, and a substituent of the monovalent cation of the substituted nitrogen-containing 6-membered ring may each independently be hydrogen, deuterium, —F, —Cl, —Br, —I, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_0$ alkoxy group, a substituted or unsubstituted $C_6$-$C_0$ aryl group, or —N(Q_1)(Q_2), and $Q_1$, and $Q_2$ may each independently be hydrogen, deuterium, a hydroxyl group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_6$-$C_{60}$ aryl group.

For example, A may be $Cs^+$.

In an embodiment, the first precursor may be represented by Formula 2-1:

$$[A][X^1] \hspace{4cm} \text{Formula 2-1}$$

wherein, in Formula 2-1, A may include a, e.g., at least one, monovalent organic-cation, a, e.g., at least one, monovalent inorganic-cation, or a combination thereof, and $X^1$ may include a, e.g., at least one, monovalent anion.

For example, A in Formula 2-1 may be $Cs^+$.

For example, $X^1$ in Formula 2-1 may be $I^-$.

In an embodiment, the first precursor may be CsI.

The second precursor may include B, and B may be an $Sn^{4+}$ ion.

In an embodiment, the second precursor may be represented by Formula 2-2:

$$[B][X_2]_4 \hspace{4cm} \text{Formula 2-2}$$

wherein, in Formula 2-2, B may be an $Sn^{4+}$ ion, and $X^2$ may be a, e.g., at least one, monovalent anion. In an embodiment, $X^1$ of Formula 2-1 and $X^2$ of Formula 2-2 may be a same monovalent anion.

For example, $X^2$ in Formula 2-2 may be $I^-$.

In an embodiment, the second precursor may be $SnI_4$.

In an embodiment, the first solvent may include dimethyl formamide (DMF) and dimethyl sulfoxide (DMSO).

In an embodiment, an amount of DMSO included in the first solvent may be in a range of about 10 volume percent (vol %) to about 15 vol %, based on 100 vol % of the total volume of DMF and DMSO.

In an embodiment, a molar ratio of the first precursor to the second precursor in the first solution may be in a range of about 2:1.7 to about 2:2.2 or about 2:1.8 to about 2:1.9.

According to stoichiometry, the molar ratio of the first precursor to the second precursor to form the perovskite compound represented by Formula 1 may be 2:1.

However, by adding the second precursor beyond the stoichiometric molar ratio, a smooth thin film with good crystallinity may be obtained. In this regard, a thin film having excellent electron mobility may be obtained.

In the second step, the second solution may be obtained by dissolving the additive including Z in the second solvent.

Here, Z may be a metal cation or a metalloid cation.

In an embodiment, Z may be $Mn^{2+}$, $Bi^{3+}$, $Sb^{3+}$, or $In^{3+}$.

In an embodiment, the additive may be represented by Formula 2-3:

$$[Z][X^3]_m \hspace{3cm} \text{Formula 2-3}$$

In Formula 2-3, Z may include a metal cation or a metalloid cation, $X^3$ may include a, e.g., at least one, monovalent anion, and m may satisfy $0<m<5$. In an embodiment, $X^1$ of Formula 2-1 and $X^3$ of Formula 2-3 may be a same monovalent anion, $X^2$ of Formula 2-2 and $X^3$ of Formula 2-3 may be a same monovalent anion, or $X^1$ of Formula 2-1, $X^2$ of Formula 2-2, and $X^3$ of Formula 2-3 may be a same monovalent anion.

For example, in Formula 2-3, Z may be $Mn^{2+}$, $Bi^{3+}$, $Sb^{3+}$, or $In^{3+}$.

For example, $X^3$ may be $I^-$.

In an embodiment, the additive may be $MnI_2$, $BiI_3$, $SbI_3$, or $InI_3$.

In an embodiment, the second solvent may be DMSO.

In the third step, based on 100 mol % of the second precursor in the first solution, e.g., a total number of moles of the second precursor in the first solution, an amount of the additive in the second solution may be in a range of about 0.1 mol % to about 30 mol %. or about 1 mol % to about 10 mol %.

The semiconductor layer 130 may be formed by spin coating, bar coating, spraying, inkjet printing, flexography, screen-printing, dip-coating, chemical deposition, atomic layer deposition, sputtering, thermal vapor deposition, or gravure coating.

In an embodiment, the method of preparing the thin-film transistor may further include a fourth step of coating the substrate 100 with the third solution obtained by mixing the first solution and the second solution. The substrate 100 may include a gate electrode and a gate insulating layer, and the gate insulating layer may be coated with the third solution.

In an embodiment, the method of preparing the thin-film transistor may further include a fifth step of annealing the substrate 100 coated with the third solution.

Definition of Terms

The term "$C_1$-$C_{60}$ alkyl group" as used herein refers to a linear or branched aliphatic hydrocarbon monovalent group that has one to sixty carbon atoms, and specific examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group.

The term "$C_2$-$C_{60}$ alkenyl group" as used herein refers to a monovalent hydrocarbon group having a, e.g., at least one, carbon-carbon double bond in the middle or at the terminus of the $C_2$-$C_{60}$ alkyl group, and examples thereof are an ethenyl group, a propenyl group, a butenyl group, and the like.

The term "$C_2$-$C_{60}$ alkynyl group" as used herein refers to a monovalent hydrocarbon group having a, e.g., at least one, carbon-carbon triple bond in the middle or at the terminus of the $C_2$-$C_{60}$ alkyl group, and examples thereof are an ethynyl group, a propynyl group, and the like.

The term "$C_1$-$C_{60}$ alkoxy group" as used herein refers to a monovalent group represented by $-OA_{101}$ (wherein $A_{101}$ is the $C_1$-$C_{60}$ alkyl group), and examples thereof are a methoxy group, an ethoxy group, an isopropyloxy group, and the like.

The term "$C_6$-$C_{60}$ aryl group" as used herein refers to a monovalent group having a carbocyclic aromatic system of six to sixty carbon atoms, and the term "$C_6$-$C_{60}$ arylene group" as used herein refers to a divalent group having a carbocyclic aromatic system of six to sixty carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be condensed with each other.

The term "biphenyl group" as used herein refers to "a phenyl group substituted with a phenyl group". In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

Hereinafter, a thin-film transistor according to an embodiment will be described in detail with reference to the following preparation examples and examples.

EXAMPLES

Preparation Examples 1-1 to 1-6: Preparation of $Cs_2SnI_6$ Precursor Solution CsI powder (99.999%, perovskite grade) and $SnI_4$ powder (anhydrous, 99.999% trace metals basis) were dissolved at a molar ratio shown in Table 1 in a solvent mixture including dimethylformamide (DMF, Sigma-Aldrich) and dimethylsulfoxide (DMSO, Sigma-Aldrich) (DMF:DMSO volume ratio=90:10), and the mixed solution was stirred for 2 hours in a hot plate at 50° C., so as to prepare a $Cs_2SnI_6$ (0.1 moles per liter (molar (M))) precursor solution. This procedure was performed in a glove box filled with nitrogen.

TABLE 1

| | Molar ratio of CsI to $SnI_4$ ($CsI:SnI_4$) |
|---|---|
| Preparation Example 1-1 | 2:1 |

TABLE 1-continued

| | Molar ratio of CsI to SnI$_4$ (CsI:SnI$_4$) |
|---|---|
| Preparation Example 1-2 | 2:1.5 |
| Preparation Example 1-3 | 2:1.7 |
| Preparation Example 1-4 | 2:1.8 |
| Preparation Example 1-5 | 2:1.9 |
| Preparation Example 1-6 | 2:2.2 |

Preparation Examples 2-1 to 2-6: Preparation of Thin Film

As shown in Table 2, each of the Cs$_2$SnI$_6$ precursor solutions prepared in various molar ratios was used to spin-coat a substrate at 8,000 revolutions per minute (rpm), and a thermal annealing process was performed thereon for 5 minutes at 100° C., so as to prepare a thin film.

TABLE 2

| | Cs$_2$SnI$_6$ precursor solution | Molar ratio of CsI to SnI$_4$ (CsI:SnI$_4$) |
|---|---|---|
| Preparation Example 2-1 | Preparation Example 1-1 | 2:1 |
| Preparation Example 2-2 | Preparation Example 1-2 | 2:1.5 |
| Preparation Example 2-3 | Preparation Example 1-3 | 2:1.7 |
| Preparation Example 2-4 | Preparation Example 1-4 | 2:1.8 |
| Preparation Example 2-5 | Preparation Example 1-5 | 2:1.9 |
| Preparation Example 2-6 | Preparation Example 1-6 | 2:2.2 |

Figure 5A:
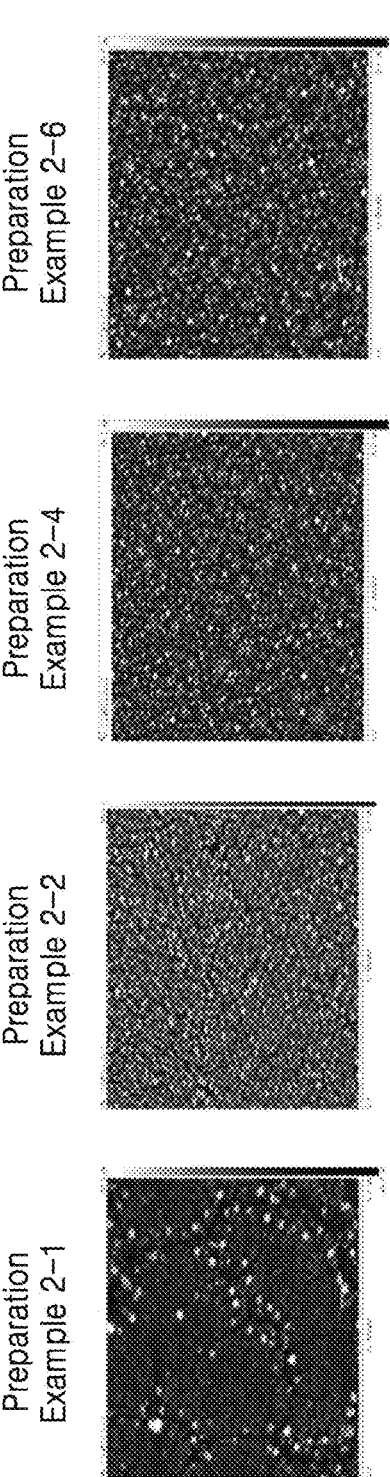
FIG. 5A shows atomic force microscopy (AFM) images of thin films of Preparation Examples 2-1, 2-2, 2-4, and 2-6.
Figure 5B:
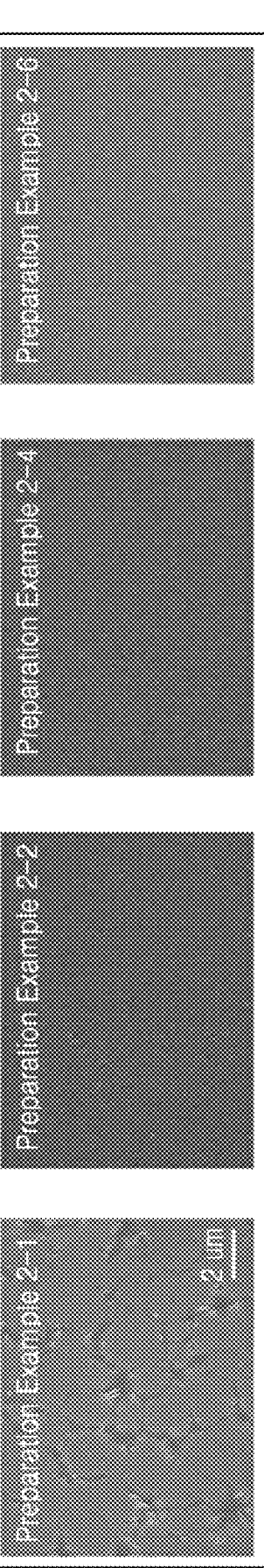
FIG. 5B shows scanning electron microscopy (SEM) images of thin films of Preparation Examples 2-1, 2-2, 2-4, and 2-6.

FIG. 5A shows atomic force microscopy (AFM) images of thin films of Preparation Examples 2-1, 2-2, 2-4, and 2-6; and FIG. 5B shows scanning electron microscopy (SEM) images of thin films of Preparation Examples 2-1, 2-2, 2-4, and 2-6. Referring to FIGS. 5A and 5B, it was confirmed that, compared to the thin films of Preparation Examples 2-1 and 2-2, the thin films of Preparation Example 2-4 and 2-6 had better smoothness.

Evaluation Example 1

Figure 6:
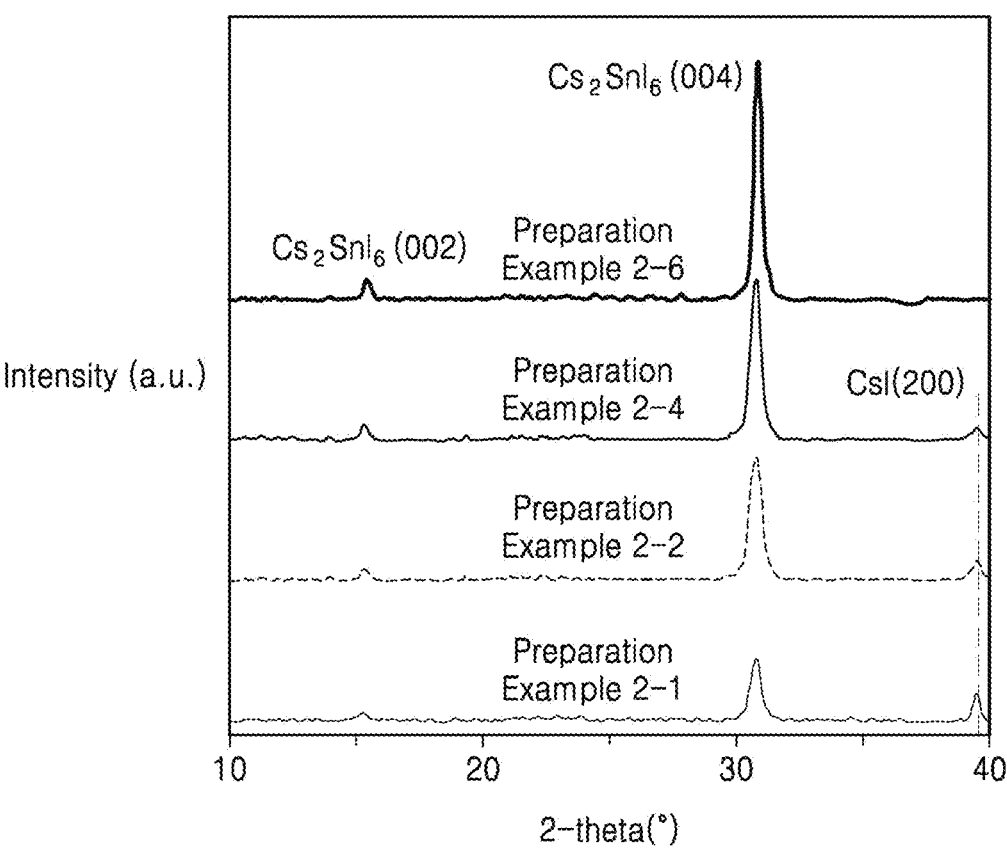
FIG. 6 is a graph of Intensity (arbitrary units (a.u.)) versus 2-theta (degrees (°)) showing X-ray diffraction (XRD) analysis results of thin films of Preparation Examples 2-1, 2-2, 2-4, and 2-6.
Figure 7:
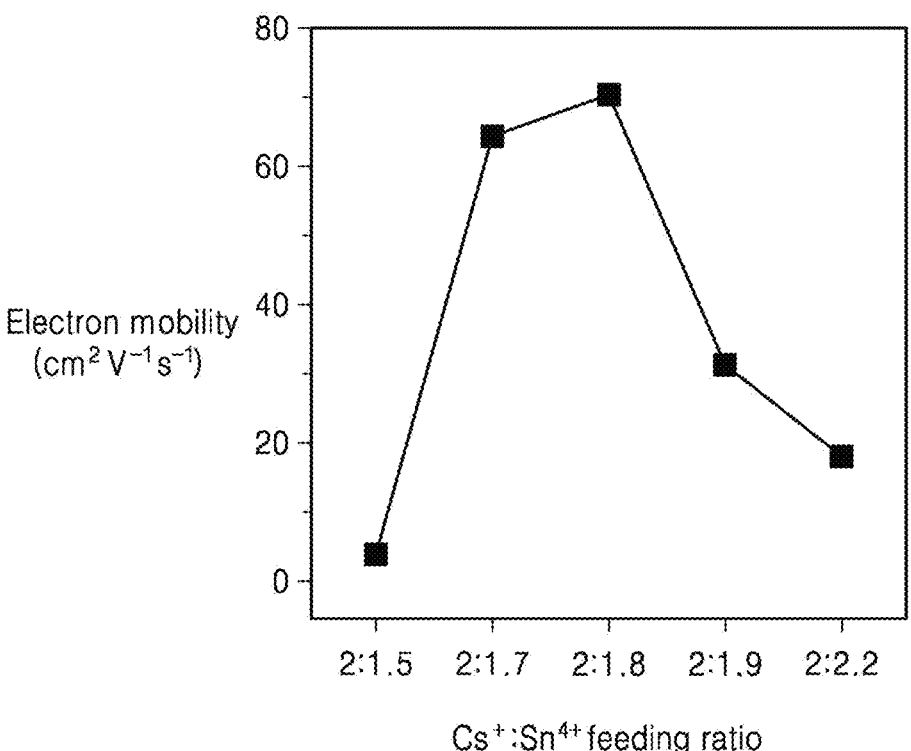
FIG. 7 is a graph of Electron mobility (square centimeters per volt-second ($cm^2\ V^{-1}\ s^{-1}$)) versus $Cs^+{:}Sn^{4+}$ feeding ratio showing electron mobility of thin films of Preparation Examples 2-2 to 2-6.

The X-ray diffraction (XRD) analysis was performed on the thin films of Preparation Examples 2-1, 2-2, 2-4, and 2-6, and results thereof are shown in FIG. 6. The electron mobility of the thin films of Preparation Examples 2-2 to 2-6 was measured, and results thereof are shown in FIG. 7. The XRD analysis was performed with CuKα radiation, and a Bruker D8 ADVANCE device was used. The electron mobility measurement was performed using the van der Pauw method, and during the measurement, an electrical signal was measured using a Keithley 4200-SCS.

FIG. 6 shows the results of the XRD analysis performed on the thin films of Preparation Examples 2-1, 2-2, 2-4, and 2-6. Referring to FIG. 6, it was confirmed that, compared to the thin films of Preparation Examples 2-1 and 2-2, the thin films of Preparation Example 2-4 and 2-6 had excellent crystallinity. That is, it was confirmed that, when SnI$_4$ was used in excess of, e.g., beyond, the stoichiometric molar ratio, the thin film had excellent crystallinity and smoothness.

FIG. 7 is a graph showing the electron mobility of thin films of Preparation Examples 2-2 to 2-6. Referring to FIG. 7, it was confirmed that, when the molar ratio of CsI to SnI$_4$ was in a range of 2:1.7 to 2:2.2, the thin film had excellent electron mobility.

Preparation Examples 3-1 and 3-2: Preparation of Precursor Solution with Different Solvents CsI powder (99.999%, perovskite grade) and SnI$_4$ powder (anhydrous, 99.999% trace metals basis) were dissolved in a solvent shown in Table 3, and the mixed solution was stirred for 2 hours in a hot plate at 50° C., so as to prepare a Cs$_2$SnI$_6$ (0.1 M) precursor solution. This procedure was performed in a glove box filled with nitrogen.

TABLE 3

| | Molar ratio of CsI to SnI$_4$ (CsI:SnI$_4$) | Solvent |
|---|---|---|
| Preparation Example 3-1 | 2:2.2 | DMF |
| Preparation Example 3-2 | 2:2.2 | DMF/DMSO (volume ratio of DMF:DMSO = 90:10) |

Figure 8:
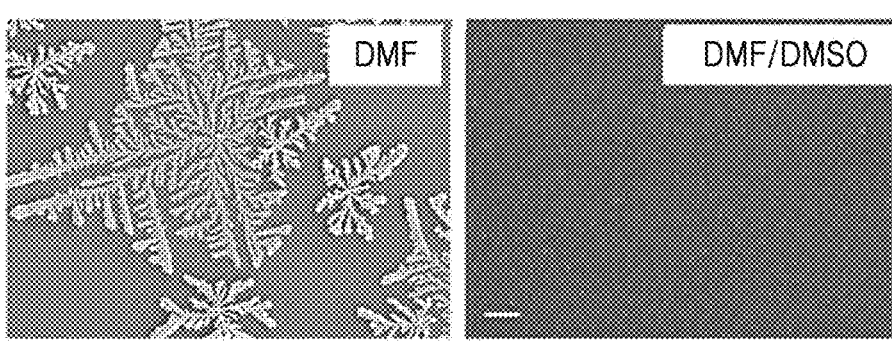
FIG. 8 shows SEM images of thin films of Preparation Examples 3-1 and 3-2.

Thin films were prepared using the precursor solutions of Preparation Examples 3-1 and 3-2, and FIG. 8 shows SEM images of each of the thin films. Referring to FIG. 8, it was confirmed that, compared to the thin film of Preparation Example 3-1, the thin film of Preparation Example 3-2 had better smoothness.

Example 1

1. Preparation of MnI$_2$ Solution

MnI$_2$ (anhydrous, 99.99% trace metals basis) was dissolved in DMF, and under the same conditions as in the preparation of the precursor solution, an MnI$_2$ solution was prepared.

2. Preparation of Thin-Film Transistor

First, a high-concentration Si substrate including SiO$_2$ (100 nanometers (nm)) (KUNSHAN SINO SILICON TECHNOLOGY, resistivity: 1 ohm-centimeters (cm) to 100 ohm-cm, SiO$_2$/Si substrate) used as a gate electrode and a gate insulating layer was washed in an ultrasonic water bath containing acetone, deionized water, and isopropyl alcohol for 10 minutes each, dried in an oven at 110° C., and then to improve surface wettability, treated under argon plasma for 60 seconds.

Before film deposition, the MnI$_2$ solution was added to the Cs$_2$SnI$_6$ precursor solution of Preparation Example 1-4 and stirred for 30 minutes at 50° C. At 8,000 rpm for 60 seconds, the SiO$_2$/Si substrate was coated with the mixed solution, and an annealing process was performed thereon at 100° C. for 5 minutes, so as to form a semiconductor layer. Here, an amount of MnI$_2$ in the mixed solution may be about 3 mole percent (mol %), based on 100 mol % of Cs$_2$Sn$_6$.

Afterwards, by using a thermal evaporator in a glove box filled with N$_2$, an Au source electrode and a drain electrode (40 nm) were evaporated with a high-vacuum shadow mask ($10^{-7}$ torr), thereby completing the manufacture of a thin-film transistor. The thin-film transistor thus manufactured had a channel length of 150 micrometers (μm) and a channel width of 1,000 μm.

Comparative Examples 1 to 4

First, a high-concentration Si substrate including $SiO_2$ (100 nm) (KUNSHAN SINO SILICON TECHNOLOGY, resistivity: 1 ohm-cm to 100 ohm-cm, $SiO_2$/Si substrate) used as a gate electrode and a gate insulating layer was washed in an ultrasonic water bath containing acetone, deionized water, and isopropyl alcohol for 10 minutes each, dried in an oven at 110° C., and then to improve surface wettability, treated under argon plasma for 60 seconds.

Then, at 8,000 rpm for 60 seconds, the $SiO_2$/Si substrate was coated with each of the $Cs_2SnI_6$ precursor solutions shown in Table 4, and an annealing process was performed thereon at 100° C. for 5 minutes, thereby forming a semiconductor layer. Afterwards, by using a thermal evaporator in a glove box filled with $N_2$, an Au source electrode and a drain electrode (40 nm) were evaporated with a high-vacuum shadow mask ($10^{-7}$ torr), thereby completing the manufacture of a thin-film transistor.

TABLE 4

|  | Additive | $Cs_2SnI_6$ precursor solution | Molar ratio of CsI to $SnI_4$ ($CsI:SnI_4$) |
|---|---|---|---|
| Example 1 | $MnI_2$ solution | Preparation Example 1-4 | 2:1.8 |
| Comparative Example 1 | — | Preparation Example 1-1 | 2:1 |
| Comparative Example 2 | — | Preparation Example 1-3 | 2:1.7 |
| Comparative Example 3 | — | Preparation Example 1-4 | 2:1.8 |
| Comparative Example 4 | — | Preparation Example 1-5 | 2:1.9 |
| Comparative Example 5 | — | Preparation Example 1-6 | 2:2.2 |

Evaluation Example 2

Figure 9:
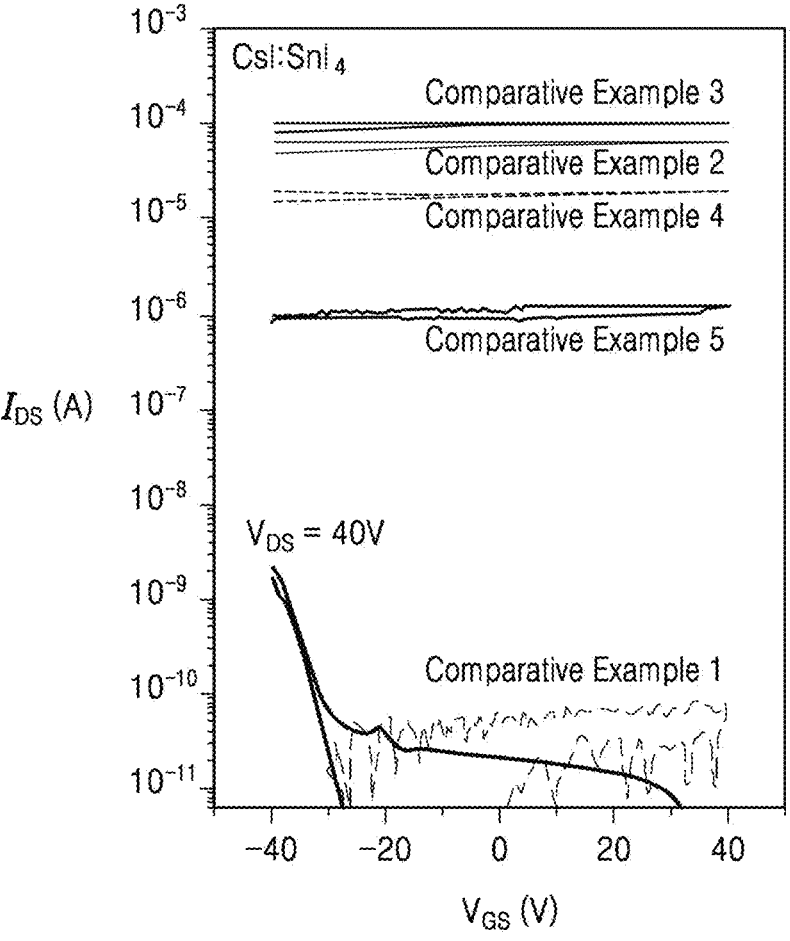
FIG. 9 is a graph of source-drain current (IDS) (amperes (A)) versus gate-source voltage ($V_{GS}$) (volts (V)) showing current on-off ratio of thin-film transistors of Comparative Examples 1 to 5.
Figure 10A:
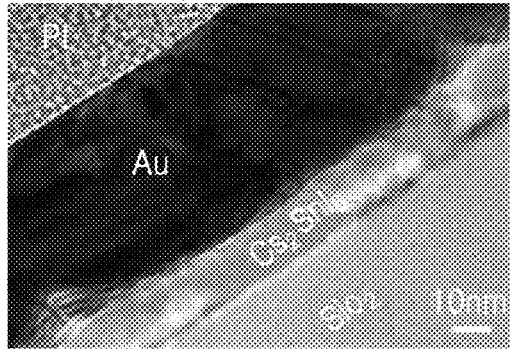
FIG. 10A is a cross-sectional view of a thin-film transistor of Example 1.
Figure 10B:
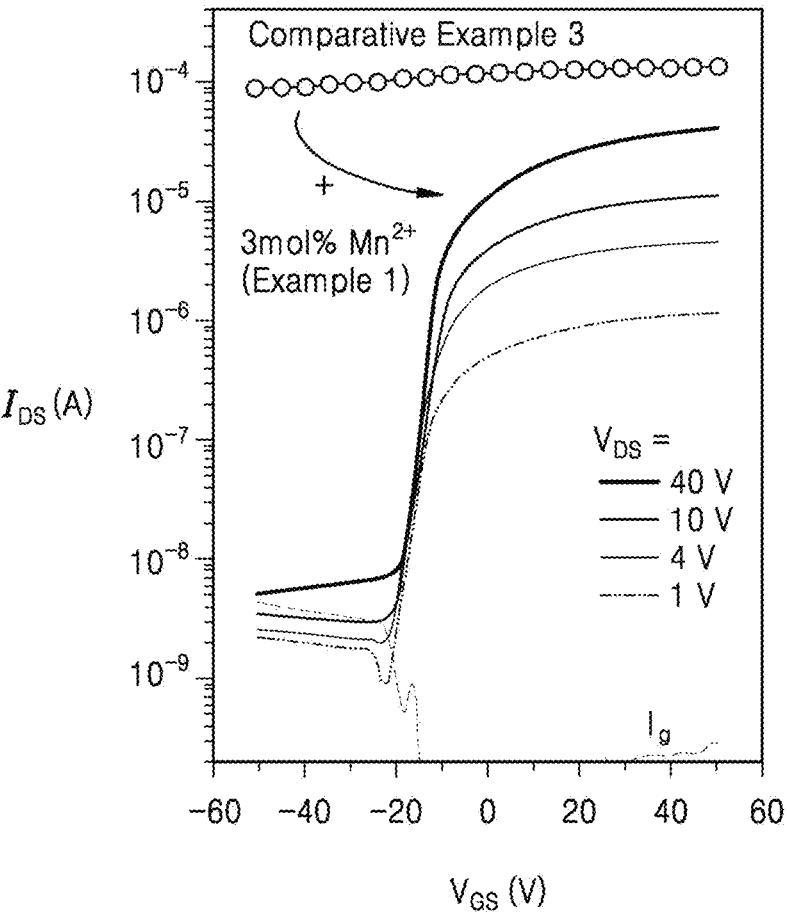
FIG. 10B is a graph of IDS (A) versus $V_{GS}$ (V) showing electron mobility and current on-off ratio of thin-film transistors of Example 1 and Comparative Example 3.
Figure 11:
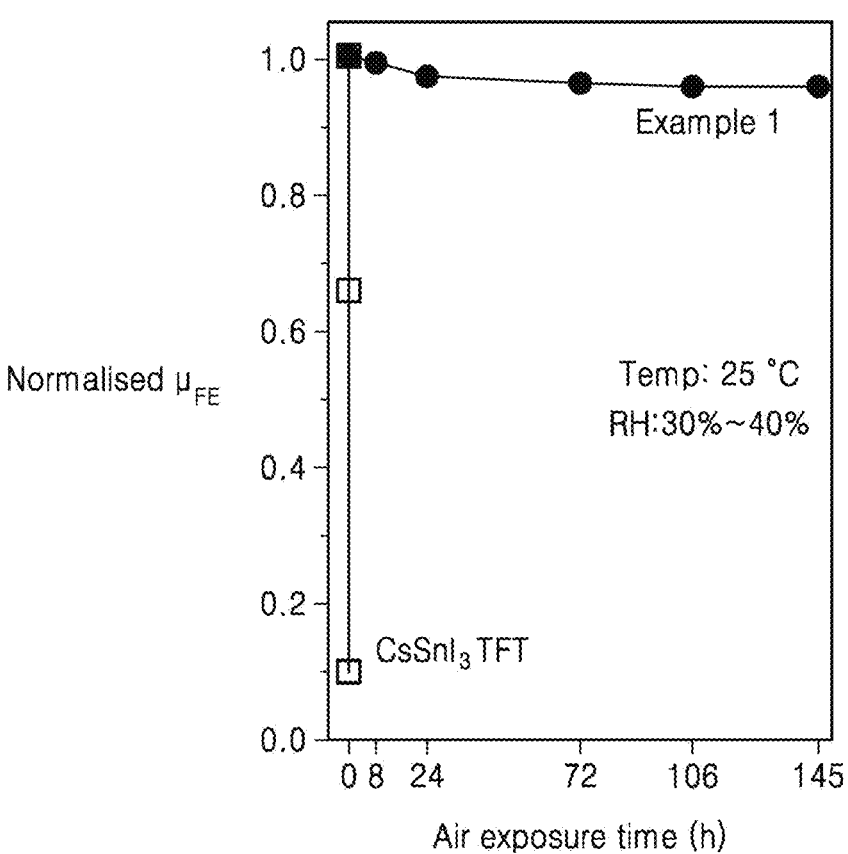
FIG. 11 is a graph of Normalised electron mobility ($\mu_{FE}$) versus Air exposure time (hours (h)) showing air stability of a thin-film transistor of Example 1.

For the thin-film transistors of Comparative Examples 1 to 5, current on-off ratios were measured, and results thereof are shown in FIG. 9. For the thin-film transistor of Example 1, electron mobility, current on-off ratio, and air stability were measured, and results thereof are shown in FIG. 10B and FIG. 11. The electron mobility ($μ_{FE}$) was calculated according to Equation 1:

$$μ_{FE} = \frac{2L}{WC_i}\left(\frac{\partial \sqrt{I_{DS}}}{\partial V_{GS}}\right)^2 \qquad \text{Equation 1}$$

wherein, in Equation 1, L represents a channel length, W represents a channel width, $C_i$ represents a dielectric area capacitance (34 nanofarads per square centimeter ($nF/cm^2$)), IDs represents source-drain current, and $V_GS$ represents gate-source voltage. The current and the voltage were measured using Keithley 4200-SCS.

FIG. 9 is a graph showing the current on-off ratios of the thin-film transistors of Comparative Examples 1 to 5. Referring to FIG. 9, it was confirmed that the thin-film transistors of Comparative Examples 2 to 5 were not able to obtain on-off current modulation according to the gate voltage application. That is, the thin-film transistors of Comparative Examples 2 to 5 had excellent electron mobility but had no on-off current available according to the gate voltage application.

Therefore, to utilize the $Cs_2SnI_6$ thin film as the semiconductor layer of the thin-film transistor, it is necessary to control the amount of charge. The thin-film transistor of the present disclosure controlled the amount of charge by including the perovskite compound, for example, $Cs_2SnI_6$, doped with a metal cation or a metalloid cation.

FIG. 10B is a graph showing the electron mobility and the current on-off ratio of the thin-film transistors of Example 1 and Comparative Example 3. In the thin-film transistor of Example 1, the $MnI_2$ solution was added so that $Cs_2SnI_6$ doped with $Mn^{2+}$ was used as the semiconductor layer.

Referring to FIG. 10B, it was confirmed that the thin-film transistor of Example 1 had excellent electron mobility and high current on-off ratio characteristics compared to the thin-film transistor of Comparative Example 3. Here, the thin-film transistor of Example 1 had the electron mobility of 1 square centimeters per volt-second ($cm^2$/Vs) and the current on-off ratio of $10^4$:1.

Figure 10C:
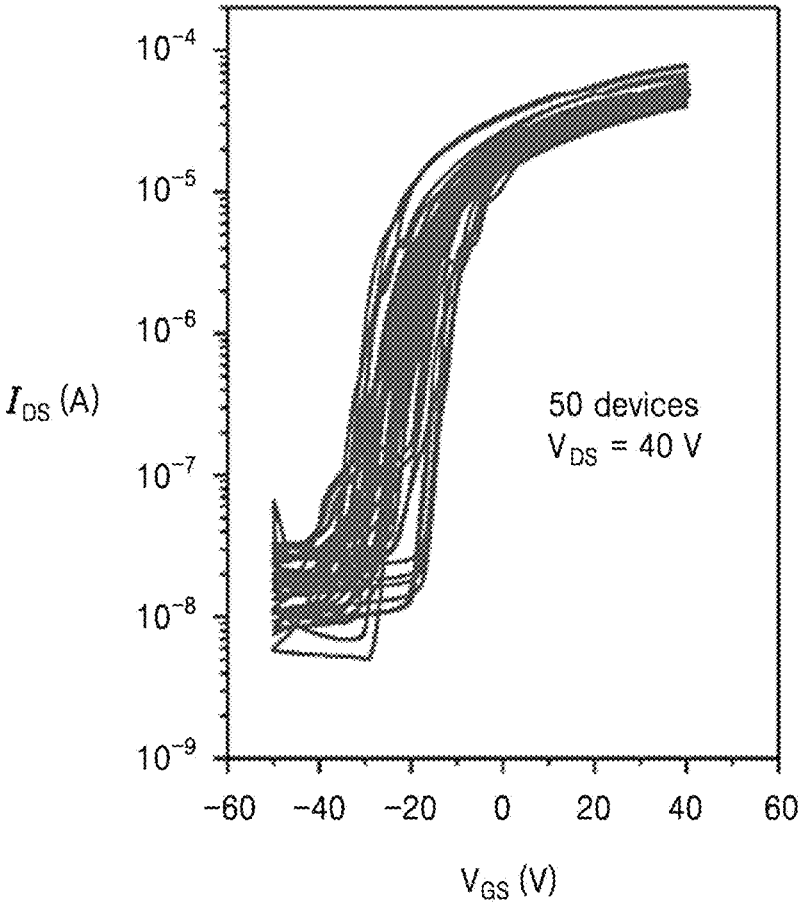
FIG. 10C is a graph of IDS (A) versus $V_{GS}$ (V) showing source-drain current (IDS) according to gate-source voltage ($V_{GS}$) of a thin-film transistor of Example 1.

FIG. 10C is a diagram showing the source-drain current (IDs) according to the gate-source voltage ($V_{GS}$) of the thin-film transistor of Example 1 at a drain-source voltage ($V_{DS}$) of 40 V.

Figure 10D:
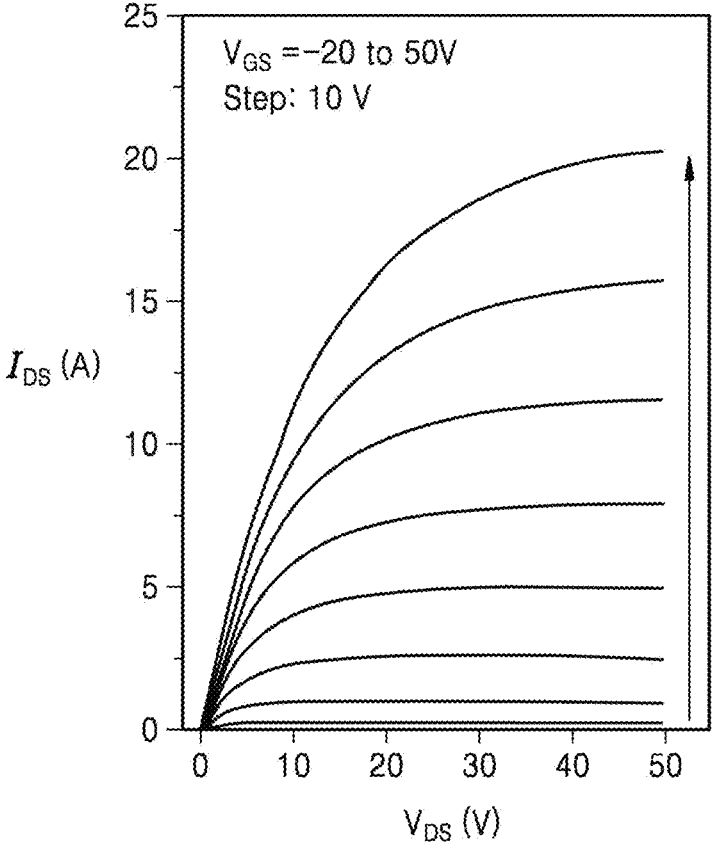
FIG. 10D is a graph of IDS (A) versus $V_{DS}$ (V) showing source-drain current (IDS) according to drain-source voltage ($V_{DS}$) of a thin-film transistor of Example 1.

FIG. 10D is a diagram showing the source-drain current (IDs) according to the drain-source voltage ($V_{DS}$) of the thin-film transistor of Example 1 at the gate-source voltage ($V_{GS}$) of −20V to 50V.

FIG. 11 is a graph showing the air stability of a thin-film transistor (TFT) of Example 1. Referring to FIG. 11, it was confirmed that the thin-film transistor of Example 1 had excellent air stability (at 25° C. and 30% to about 40% relative humidity (RH)) compared to the $CsSnI_3$ thin-film transistor using $Sn^{2+}$.

According to an embodiment, by using of a tin-based perovskite compound as a semiconductor layer, a thin-film transistor having excellent electron mobility and air stability and a method of preparing the thin-film transistor may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A thin-film transistor comprising:
a gate electrode;
a gate insulating layer that is in contact with the gate electrode;
a semiconductor layer insulated from the gate electrode by the gate insulating layer; and
a source electrode and a drain electrode that are in contact with the semiconductor layer,
wherein the semiconductor layer comprises a perovskite compound represented by Formula 1 doped with a metal cation or a metalloid cation:

$$[A]_2[B][X]_6 \qquad \text{Formula 1}$$

wherein, in Formula 1,

A comprises a monovalent organic-cation, a monovalent inorganic-cation, or a combination thereof, B comprises $Sn^{4+}$, and X comprises a monovalent anion.

2. The thin-film transistor of claim 1, wherein A comprises $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a monovalent cation of a substituted or unsubstituted nitrogen-containing 5-membered ring, a monovalent cation of a substituted or unsubstituted nitrogen-containing 6-membered ring, $Li^+$, $Na^+$, $K^+$, $Rb^+$, $Cs^+$, $Fr^+$, or a combination thereof, wherein $R_1$, $R_2$, $R_3$, $R_4$, and $R_5$, a substituent of the monovalent cation of the substituted nitrogen-containing 5-membered ring, and a substituent of the monovalent cation of the substituted nitrogen-containing 6-membered ring are each independently hydrogen, deuterium, —F, —Cl, —Br, —I, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{60}$ aryl group, or —N(Q_1)(Q_2), and $Q_1$, and $Q_2$ are each independently hydrogen, deuterium, a hydroxyl group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_6$-$C_{60}$ aryl group.

3. The thin-film transistor of claim 1, wherein X comprises a halide anion.

4. The thin-film transistor of claim 1, wherein the metal cation or the metalloid cation comprises $Mn^{2+}$, $Bi^{3+}$, $Sb^{3+}$, or $In^{3+}$.

5. The thin-film transistor of claim 1, wherein an amount of the metal cation or the metalloid cation in the semiconductor layer is in a range of about 0.1 mole percent to about 30 mole percent, based on a total number of moles of B.

6. The thin-film transistor of claim 1, wherein electron mobility of the thin-film transistor is in a range of about 0.5 square centimeters per volt-second to about 10 square centimeters per volt-second.

7. The thin-film transistor of claim 1, wherein a current on-off ratio of the thin-film transistor is in a range of about 10:1 to about 105:1.

8. An electronic device comprising:

a light-emitting device comprising a first electrode, a second electrode facing the first electrode, an interlayer between the first electrode and the second electrode; and the thin-film transistor of claim 1, wherein one of the source electrode and the drain electrode of the thin-film transistor is electrically connected to first electrode of the light-emitting device.

9. The electronic device of claim 8, wherein the interlayer comprises an emission layer, and the interlayer optionally comprises a hole transport region between the first electrode and the emission layer, an electron transport region between the emission layer and the second electrode, or a combination thereof.

10. A method of preparing the thin-film transistor of claim 1, the method comprising:

forming the gate electrode on a substrate;

forming the gate insulating layer on the substrate;

forming the semiconductor layer on the gate insulating layer; and forming the source electrode and the drain electrode on the semiconductor layer, wherein the forming of the semiconductor layer comprises:

a first step of obtaining a first solution containing a first precursor comprising A, a second precursor comprising B, and a first solvent;

a second step of obtaining a second solution containing an additive comprising the metal cation or the metalloid cation and a second solvent; and a third step of mixing the first solution and the second solution, wherein the first solvent comprises dimethyl formamide and dimethyl sulfoxide.

11. The method of claim 10, wherein a molar ratio of the first precursor to the second precursor in the first solution is in a range of about 2:1.7 to about 2:2.2.

12. The method of claim 10, wherein a volume ratio of dimethyl formamide to dimethyl sulfoxide in the first solvent is in a range of about 90:10 to about 85:15.

13. The method of claim 10, wherein the first precursor is represented by Formula 2-1:

$$[A][X^1] \qquad\qquad \text{Formula 2-1}$$

wherein, in Formula 2-1, A comprises at least one monovalent organic-cation, at least one monovalent inorganic-cation, or any combination thereof, and $X^1$ comprises a monovalent anion.

14. The method of claim 10, wherein A comprises $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a monovalent cation of a substituted or unsubstituted nitrogen-containing 5-membered ring, a monovalent cation of a substituted or unsubstituted nitrogen-containing 6-membered ring, $Li^+$, $Na^+$, $K^+$, $Rb^+$, $Cs^+$, Fr, or a combination thereof, wherein $R_1$, $R_2$, $R_3$, $R_4$, and $R_5$, a substituent of the monovalent cation of the substituted nitrogen-containing 5-membered ring, and a substituent of the monovalent cation of the substituted nitrogen-containing 6-membered ring are each independently hydrogen, deuterium, —F, —Cl, —Br, —I, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{60}$ aryl group, or —N(Q_1)(Q_2), and $Q_1$, and $Q_2$ are each independently hydrogen, deuterium, a hydroxyl group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_6$-$C_{60}$ aryl group.

15. The method of claim 10, wherein the second precursor is represented by Formula 2-2:

$$[B][X^2]_4 \qquad\qquad \text{Formula 2-2}$$

wherein, in Formula 2-2, B comprises $Sn^{4+}$ ion, and $X^2$ comprises a monovalent anion.

16. The method of claim 10, wherein the additive comprising the metal cation or the metalloid cation is represented by Formula 2-3:

$$[Z][X^3]_m \qquad\qquad \text{Formula 2-3}$$

wherein, in Formula 2-3, Z comprises the metal cation or the metalloid cation, $X^3$ comprises a monovalent anion, and m satisfies $0<m<5$.

17. The method of claim 10, wherein Z comprises $Mn^{2+}$, $Bi^{3+}$, $Sb^{3+}$, or $In^{3+}$.

18. The method of claim 10, wherein the second solvent comprises dimethyl sulfoxide.

19. The method of claim 10, wherein, in the third step, based on a total number of moles of the second precursor in the first solution, an amount of the additive in the second solution is in a range of about 0.1 mole percent to about 30 mole percent.

20. The method of claim 10, wherein the semiconductor layer is formed by spin coating, bar coating, spraying, inkjet printing, flexography, screen-printing, dip-coating, chemical deposition, atomic layer deposition, sputtering, thermal vapor deposition, or gravure coating.

* * * * *